US007877862B2

(12) United States Patent
Cole et al.

(10) Patent No.: US 7,877,862 B2
(45) Date of Patent: Feb. 1, 2011

(54) WELDLESS MESOTUBE GRID HOLDER

(75) Inventors: Barrett E. Cole, Bloomington, MN (US); Tzu-Yu Wang, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 466 days.

(21) Appl. No.: 11/985,023

(22) Filed: Nov. 13, 2007

(65) Prior Publication Data

US 2009/0121406 A1 May 14, 2009

(51) Int. Cl.
*H05K 13/04* (2006.01)

(52) U.S. Cl. .............................. 29/729; 29/739; 29/740; 29/759; 29/760; 269/296

(58) Field of Classification Search ................... 29/729, 29/739, 740, 759, 760; 269/296
See application file for complete search history.

(56) References Cited

U.S. PATENT DOCUMENTS 5,194,709 A 3/1993 Ichikawa et al. ............ 219/109
5,225,968 A * 7/1993 Ma ............................ 361/791
7,002,095 B2 2/2006 Kato et al. ............... 219/86.41
7,087,854 B2 8/2006 Takahashi et al. ........ 219/91.22
7,091,440 B2 8/2006 Gabbianelli et al. ........... 219/87
7,197,933 B2 4/2007 Arndt et al. .................... 73/644
7,230,432 B2 6/2007 Cole et al. .................. 324/464
2007/0114264 A1 5/2007 Cole et al. ................ 228/49.5

* cited by examiner

*Primary Examiner*—Derris H Banks
*Assistant Examiner*—Azm Parvez
(74) *Attorney, Agent, or Firm*—Kermit D. Lopez; Luis M. Ortiz; Kris T. Fredrick

(57) ABSTRACT

An apparatus for assembling an electronic device is disclosed, which includes one or more grid holders for maintaining one or more grids in association with a plurality of conducting components positioned perpendicular to the grid(s). One or more insulating components are also provided for mounting and supporting the conducting components. The grid holder(s) can be pushed onto the conducting components in order to eliminate the need for applying spot weld currents to the conducting components and thereby provide a weldless assembly apparatus for the precise construction of an electronic device.

18 Claims, 2 Drawing Sheets

WELDLESS MESOTUBE GRID HOLDER

TECHNICAL FIELD

Embodiments are generally related to mesotube construction. Embodiments are also related to the construction of mesotubes utilizing weldless configuration techniques. Embodiments are also related to grid holders utilized in the construction of mesotubes.

BACKGROUND OF THE INVENTION

In many electronic devices such as mesotubes and the like, it is necessary to place grids or other plates in precise relationship to other similar grids or plates. In a mesotube, the grids must be essentially parallel to each other and must be spaced by a precise distance to operate efficiently. The grids or plates are supported on electrodes that permit the device to function.

For example, a tungsten lower grid in a typical mesotube is to be supported on three header pins or electrodes that are perpendicular to the plane of the grid and the upper grid is to be supported on three other header pins or electrodes that also are perpendicular to that grid. The two grids are to be spaced by a precise distance, in one design by 15 to 20 mils with a tolerance of no more than approximately + or −0.1 mil. The preferred method of attaching the grids to the electrodes, as is done in many present day electronic devices using grids, is to spot weld the grid to the electrode.

An example of an arrangement utilized in the construction of mesotubes is disclosed in U.S. Patent Publication No. 20070114264 entitled "Mesotube Electrode Attachment," which was published on May 24, 2007 to Barrett E. Cole, et al. U.S. Patent Publication No. 20070114264 is incorporated herein by reference and discloses a device for positioning a shaped element on a surface of another element mounted on a mechanism to permit welding the element to the surface. As disclosed in U.S. Patent Publication No. 20070114264, an insulating fixture mounts the device on the mechanism and positions an extension having a clamp locating end that positions a clamp for holding the shaped element in a precise position in contact with the surface during welding. The clamp is conductive and directs current from the welding to the insulating fixture and prevents insulating fixture and prevents passage of current on the shaped element beyond the clamp.

The spot weld process utilized in prior art mesotube construction arrangements such as that disclosed in U.S. Patent Publication No. 20070114264 is fairly robust and can create damage to the insulators, which can lead to a leak. Additionally, spot welding of grids to header pins in a mesotube design can lead to defects (points) on the pin, which can generate a premature breakdown in the resulting structure in the absence of UV (Ultraviolet) radiation. It is therefore desired to eliminate both of these problems.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for an improved an improved assembly apparatus for constructing an electronic device.

It is another aspect of the present invention to provide for a mesotube assembly apparatus.

It is yet a further aspect of the present invention to provide for a weldless mesotube assembly apparatus.

The aforementioned aspects of the invention and other objectives and advantages can now be achieved as described herein. An apparatus for assembling an electronic device is disclosed, which includes one or more grid holders for maintaining one or more grids in association with a plurality of conducting components positioned perpendicular to the grid (s). One or more insulating components are also provided for mounting and supporting the conducting components. The grid holder(s) can be pushed onto the conducting components in order to eliminate the need for applying spot weld currents to the conducting components and thereby provide a weldless assembly apparatus for the precise construction of an electronic device.

The insulating component(s) can constitute a header for mounting the conducting components, and the grid(s) is welded off the header, thereby negating breakdown problems caused by weld damage to the conducting components. The electronic device assembled via the assembly apparatus can be, for example, a mesotube based on two or more wafers connected to the conducting components. The grid holder preferably comprises a material that is readily weldable, such as copper. Such a material is preferably compatible with tungsten. The conducting components can be, for example, devices such as pins, electrodes, posts and the like.

The apparatus thus provides an intermediate part to which the grids are welded off the header. This negates the breakdown problem caused by weld damage to the pins. Breakdown damage to the grids is lessened because the intermediate part—the grid holder is made of material that is easily weldable such as copper and compatible with tungsten. This grid does not need to be configured from tungsten but can be made of any readily welded material. The second benefit is that the grid holder is pushed onto the pins and this eliminates applying spot weld currents to the pins which tends to damage the insulator around the pins and create vacuum leaks. The part can be configured so that there is a minimal distance between the two grids A second (cathode) grid can be configured from a material to which tungsten can be readily welded. Additionally, the second cathode structure can be machined of any material and plated with tungsten. Copper is desirable as the machined material because it possesses a low vapor pressure, is easy to machine and weld and is soft and malleable so that it can be pushed onto the pins.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
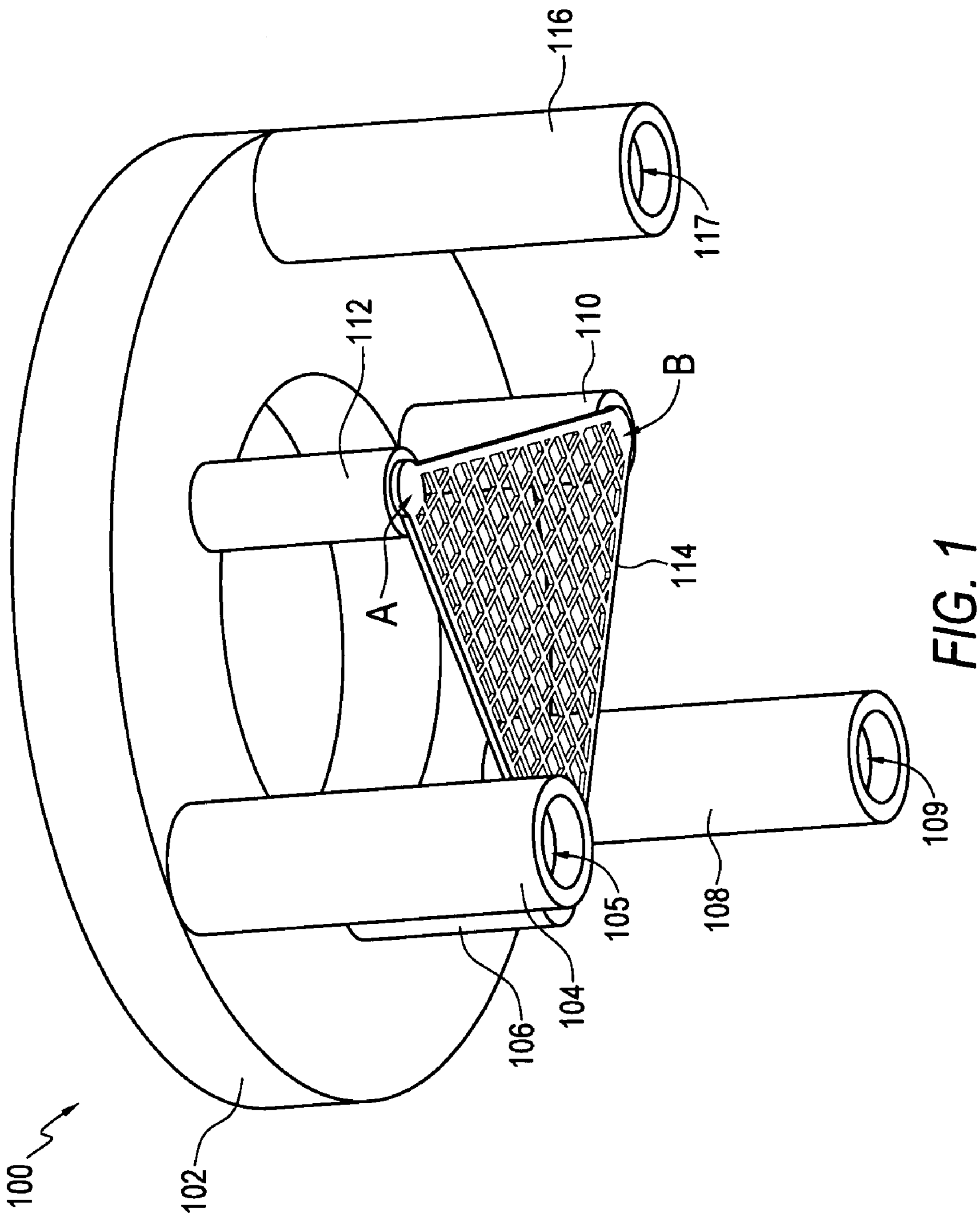
FIG. 1 illustrates a pictorial perspective view of a portion of an improved mesotube assembly apparatus, which can be implemented in accordance with a preferred embodiment.
Figure 2:
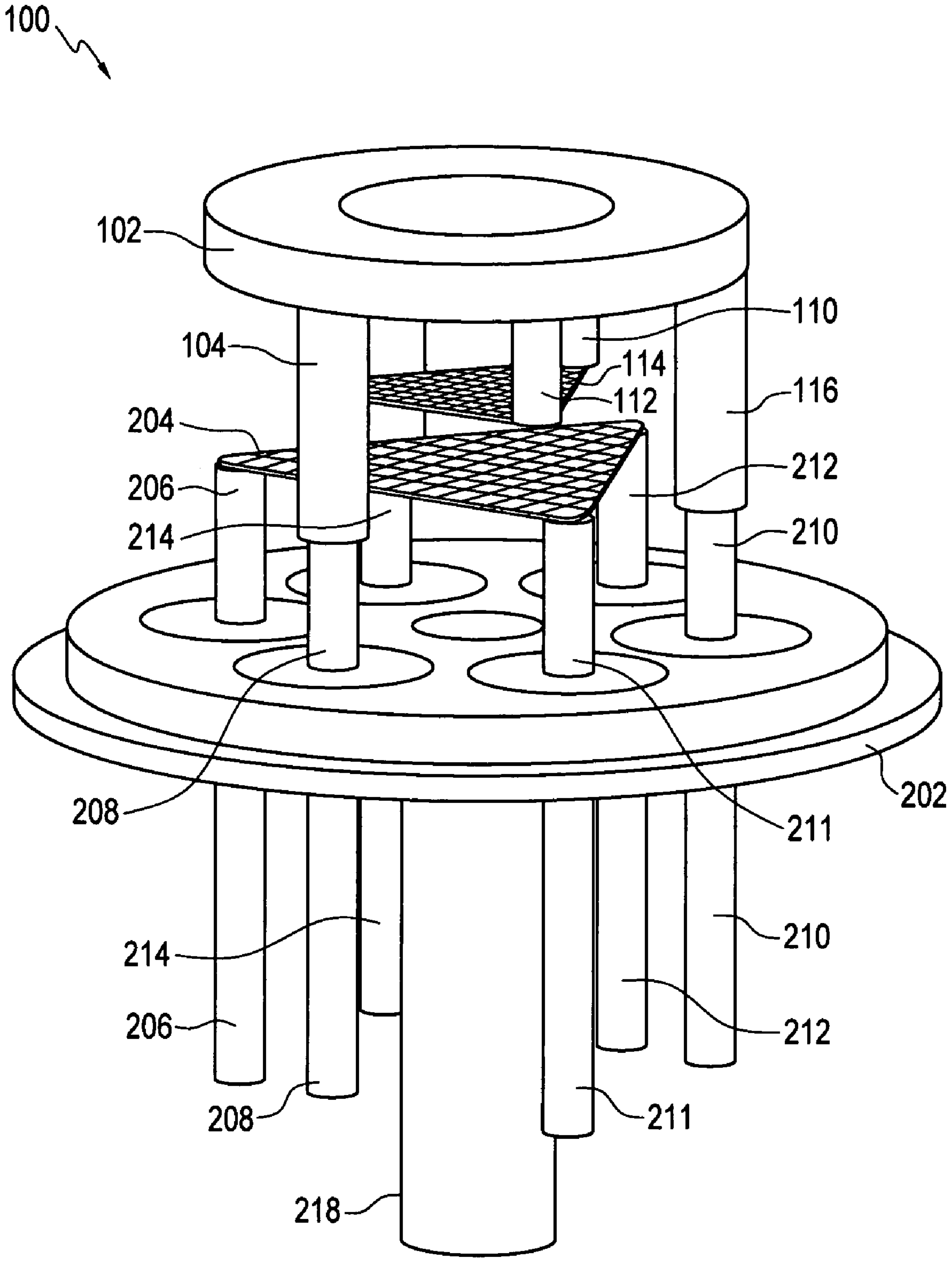
FIG. 2 illustrates a full pictorial perspective view of the improved mesotube assembly apparatus depicted in FIG. 1, in accordance with a preferred embodiment.

FIG. 1 illustrates a pictorial perspective view of a portion of an improved mesotube assembly apparatus 100, which can be implemented in accordance with a preferred embodiment. FIG. 2 illustrates a full pictorial perspective view of the improved mesotube assembly apparatus 100 depicted in FIG. 1, in accordance with a preferred embodiment. Note that in FIGS. 1-2 identical or similar parts or elements are generally indicated by identical reference numerals. The assembly apparatus 100 constitutes a weldless assembly that includes a grid 114 located centrally below a ring 102 to which a plurality of posts 104, 106, 108, 110, 112, 116 are connected. In one embodiment, the posts or pins 104, 108, 116 respectively include holes 105, 109, and 117, which can each be configured, for example, as a 60 mil diameter with 40 mil hole of depth precise to 1 mil to press fit onto package pins.

The grid 114 can be rotated 60 degrees with respect to the posts 104, 106, 108, 110, 112, 116. In FIG. 1, points A and B represent locations where spot welding of the grid 114 can take place. A header 202 is disposed below the ring 102. Thus, the grid 114 can be attached to the components 112, 110, 106 away from the header.

One or more components 206, 208, 210, 211, 212, 214 pass through above and below the header 202. Note that components 208 and 211 generally function as header pins with respect to the header 202. Another grid 204 is disposed above and connected to the pins or posts 206, 211, and 212 above the header 202. The components 206, 208, 210, 211, 212, 214 and 104, 106, 108, 110, 112, 116 can constitute conducting components and disposed generally perpendicular to the grids 114 and 204. Note that components 104, 106 constitute posts. A gas fill tube 218 is also disposed below the header 202.

The apparatus 100 can be utilized for assembling an electronic device such as, as, for example, a mesotube. Components 106, 112, 110 thus constitutes holders for maintaining grid 114 in association with a plurality of conducting components positioned perpendicular to the grid(s) 114. One or more insulating components can also be provided for mounting and supporting the conducting components. The grid holders 106, 112, 110 can be pushed onto the conducting components in order to eliminate the need for applying spot weld currents to the conducting components and thereby provide a weldless assembly apparatus 100 for the precise construction of an electronic device.

The insulating component(s) can constitute the header 202 for mounting the conducting components, and the grid(s) 114 and or 112, can be welded off the header 202, thereby negating breakdown problems caused by weld damage to the conducting components. The electronic device assembled via the assembly apparatus 100 can be, for example, a mesotube based on two or more wafers connected to the conducting components. The grid holder preferably comprises a material that is readily weldable, such as copper. Such a material is preferably compatible with tungsten. The conducting components can be, for example, devices such as pins, electrodes, posts and the like.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The embodiments of the invention in which an exclusive property or right is claimed are defined as follows. Having thus described the invention what is claimed is:

1. An apparatus for assembling an electronic device, comprising:

at least one grid holder for maintaining at least one grid, wherein said at least one grid holder comprises a material that is weldable;

a plurality of conducting components positioned perpendicular to said at least one grid; and at least one insulating component for mounting and supporting said plurality of conducting components, wherein said at least one grid holder is pushed onto said plurality of conducting components, thereby eliminating a need for applying spot weld currents to said plurality of conducting components and providing a weldless assembly apparatus for the precise construction of an electronic device.

2. The apparatus of claim 1 wherein said at least one insulating component comprises a header for mounting said plurality of conducting components, said at least one grid welded off said header, thereby negating breakdown problems caused by weld damage to said plurality of conducting components.

3. The apparatus of claim 1 wherein said electronic device comprises a mesotube having at least two grids connected to said plurality of conducting components, wherein said at least one grid holder comprises a support structure that is further from said at least two grids than a distance between said at least two grids.

4. The apparatus of claim 1 wherein said material comprises copper.

5. The apparatus of claim 1 wherein said material is compatible with tungsten.

6. The apparatus of claim 1 wherein said plurality of conducting components comprises a plurality of pins.

7. The apparatus of claim 1 wherein said plurality of conducting components comprises a plurality of electrodes.

8. The apparatus of claim 1 wherein said plurality of conducting components comprises a plurality of posts.

9. An apparatus for assembling an electronic device, comprising:

at least one grid holder for maintaining at least one grid wherein said at least one grid holder comprises a material that is weldable;

a plurality of conducting components positioned perpendicular to said at least one grid; and at least one insulating component for mounting and supporting said plurality of conducting components, wherein said at least one grid holder is pushed onto said plurality of conducting components in order to eliminate a need for applying spot weld currents to said plurality of conducting components and thereby provide a weldless assembly apparatus for the precise construction of an electronic device and wherein said at least one insulating component comprises a header for mounting said plurality of conducting components, said at least one grid welded off said header, thereby negating breakdown problems caused by weld damage to said plurality of conducting components.

10. The apparatus of claim 9 wherein said electronic device comprises a mesotube having at least two grids connected to said plurality of conducting components, wherein said at least one grid holder comprises a support structure that is further from said at least two grids than a distance between said at least two grids.

11. The apparatus of claim 10 wherein said material comprises copper.

12. The apparatus of claim 10 wherein said material is compatible with tungsten.

13. The apparatus of claim 10 wherein said plurality of conducting components comprises a plurality of pins.

14. The apparatus of claim 10 wherein said plurality of conducting components comprises a plurality of electrodes.

15. The apparatus of claim 10 wherein said plurality of conducting components comprises a plurality of posts.

16. An apparatus for assembling an electronic device, comprising:

a mesotube having at least two grids;

at least one grid holder for maintaining at least one grid, wherein said at least one grid holder;

a plurality of conducting components positioned perpendicular to said at least one grid, said at least two grids of said mesotube connected to said plurality of conducting components, wherein said at least one grid holder comprises a support structure that is further from said at least two grids than a distance between said at least two grids; and at least one insulating component for mounting and supporting said plurality of conducting components, wherein said at least one grid holder is pushed onto said plurality of conducting components in order to eliminate a need for applying spot weld currents to said plurality of conducting components and thereby provide a weldless assembly apparatus for the precise construction of said mesotube, said at least one insulating component comprises a header for mounting said plurality of conducting components, said at least grid welded off said header, thereby negating breakdown problems caused by weld damage to said plurality of conducting components.

17. The apparatus of claim 16 wherein said at least one grid holder comprises a material that is readily weldable.

18. The apparatus of claim 16 wherein said plurality of conducting components comprises at least one of the following:

a plurality of pins;

a plurality of electrodes; and a plurality of posts.

* * * * *